(12) United States Patent
Ueno

(10) Patent No.: US 6,224,712 B1
(45) Date of Patent: May 1, 2001

(54) POLISHING APPARATUS

(75) Inventor: Hisashi Ueno, Tokyo (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 09/023,209

(22) Filed: Feb. 13, 1998

(30) Foreign Application Priority Data

Feb. 17, 1997 (JP) .................................................. 9-031951

(51) Int. Cl.$^7$ ..................................................... C23F 1/02
(52) U.S. Cl. ............................... 156/345; 216/88; 216/89
(58) Field of Search ......................... 216/88, 89; 156/345

(56) References Cited

U.S. PATENT DOCUMENTS

| | | | |
|---|---|---|---|
| 5,205,082 | 4/1993 | Shendon et al. ..................... | 51/283 R |
| 5,635,083 | * 6/1997 | Breivogel et al. ...................... | 216/88 |
| 5,670,001 | * 9/1997 | Togawa et al. ....................... | 156/345 |
| 5,770,522 | * 6/1998 | Bronson ............................... | 438/692 |
| 5,916,412 | * 6/1999 | Nakashiba et al. ................... | 156/345 |
| 5,948,206 | * 9/1999 | Inaba et al. .......................... | 156/345 |
| 6,019,868 | * 2/2000 | Kimura et al. ....................... | 156/345 |
| 6,033,520 | * 3/2000 | Kimura et al. ....................... | 156/345 |
| 6,077,385 | * 6/2000 | Kimura et al. ....................... | 156/345 |

FOREIGN PATENT DOCUMENTS

| | | |
|---|---|---|
| 64-40266 | 2/1989 | (JP) . |
| 6-79618 | 3/1994 | (JP) . |
| 7-40231 | 2/1995 | (JP) . |
| 7-314301 | 12/1995 | (JP) . |
| 9-70750 | 3/1997 | (JP) . |
| 9-267257 | 10/1997 | (JP) . |

* cited by examiner

*Primary Examiner*—Benjamin L. Utech
*Assistant Examiner*—Charlotte A. Brown
(74) *Attorney, Agent, or Firm*—Foley & Lardner

(57) ABSTRACT

A polishing apparatus can stabilize polishing speed at the peripheral end portion of a polishing object, such as a wafer for fabricating a semiconductor device. The polishing apparatus performs polishing by arranging the polishing object in opposition to an abrasive cloth on a rotary polishing table, applying a load on a polishing block and with supplying a polishing fluid. A ring-shaped retainer is provided for embracing a given thickness of a elastic buffering plate provided between the polishing object fixing block and the polishing object for making contact pressure between the polishing object and the abrasive plate uniform and whereby for making a polishing speed of the polishing object constant.

16 Claims, 10 Drawing Sheets

DISTANCE FROM WAFER CENTER (mm)

DISTANCE FROM WAFER CENTER (mm)

POLISHING APPARATUS

BACKGROUND OF THE INVENTION

1. Field of the Invention

The present invention relates generally to a polishing apparatus. More specifically, the invention relates to a polishing apparatus for planarizing roughness or unevenness on a surface of a semiconductor substrate or the like.

2. Description of the Related Art

In the recent years, in a fabrication process of a semiconductor, a polishing process has been used for planarization of roughness or unevenness of a semiconductor substrate or of step of element and wiring on the surface of the semiconductor substrate. The polishing process typically employs a system to selectively polish protruding portion for removal and whereby to achieve complete planarization.

Constructions of the conventional polishing apparatus typically employed have been disclosed in Japanese Unexamined Patent Publication No. Showa 59(1984)-187456, Japanese Unexamined Patent Publication No. Heisei 7(1995)-221053 and Japanese Unexamined Patent Publication No. Showa 58(1983)-22657. For example, as shown in FIG. 4(a), the typical polishing apparatus is constructed with a polishing object holding means (hereinafter referred to as "fixing block") 302 for holding a polishing object 101 via a buffering plate 303, such as a semiconductor wafer or the like and rotating carrying the polishing object, and a rotary polishing table 106. The buffering plate 303 is necessary for absorbing a load locally exerted on the polishing object 101 and whereby for improving uniformity of a polished surface. As the buffering plate, DF200 manufactured by Rodel, U.S.A. has been generally used. DF200 has a laminated structure of a polyurethane foamed layer and polyester sheet base material and has a compressibility factor (in accordance with a standard of JIS L-1096) of 33%. For instance, DF200 adapted for 6 inch wafer has an external diameter of 150 mm and a thickness of 0.6 mm. On the other hand, in order to prevent the polishing object 101 from loosing off the fixing block 302, a retainer ring 304 having an internal diameter of 151 mm and a thickness of 7 mm is engaged on the outer periphery of the fixing block 304.

On an upper surface of the rotary polishing table 106 having a rotary drive shaft 105A, an abrasive cloth is bonded. The abrasive cloth is typically used with lapping over an abrasive cloth 107 (upper layer) and an abrasive cloth 108 (lower layer). As the abrasive cloth 107, IC1000 manufactured by Rodel, is frequently used. The abrasive cloth 107 is formed by foaming and hardening urethane resin and is hard having a hardness factor of 95 in an Asker C hardness meter. On the other hand, as the abrasive cloth 108, Suba400 manufactured by Rodel Nitta Company is frequently used, which is formed by impregnating polyurethane resin into a polyester fiber non-woven fabric and soft having a hardness factor of 61 in the Asker C hardness meter. Functions of the abrasive cloths 107 and 108 is that the abrasive cloth 107 serves for increasing flatness and the abrasive cloth 108 serves for absorbing camber or undulation of the surface of the polishing object 101 to improve uniformity of the polishing surface. On the other hand, a polishing fluid supply nozzle 109 is provided at the center portion above the abrasive cloth 107.

Next, operation of the foregoing polishing apparatus under typical polishing condition will be discussed. When a polishing fluid 110 containing solid component, such as silicon oxide or the like is supplied in a rate of 200 cc/min on the abrasive cloth 107 rotating at a rotation speed of 30 r.p.m., the polishing fluid 110 propagates along the upper surface of the abrasive cloth 107 from the center portion to the end portion. Under this condition, the polishing object 101 held on the fixing block 302 is fitted on the abrasive cloth 107 under pressure. Then, polishing is performed with applying a 7 psi (not shown) of load on the fixing block 302. At this time, in order to certainly maintain uniformity of in-plane polishing speed of the polishing object 101, the fixing block 302 is also rotated on own axis at a speed of 30 r.p.m.

FIG. 4C is a chart showing a polishing speed in a direction including a diameter extending cross the center of the polishing object 101 polished by an apparatus shown in FIG. 4A and extending perpendicular to a polishing surface. The shown profile is the same in the profile of any diametrical direction taking the center of the polishing object 101 as an origin. Since FIG. 4C is a bilateral symmetric profile with respect to the origin, discussion will be given for the polishing speed of the polishing object 101 from an edge in the plus direction to the origin.

At the edge portion (a region of +73 to +75 mm) of the polishing object 101, the polishing speed is quite high. Conversely, in a region of +60 to +73 mm, the polishing speed is low, and has a minimum point in a region of +71 to +73 mm. In a region of 0 to +60 mm, the polishing speed is uniform. A tendency of the polishing speed at the end portion of the polishing object 101 is caused due to difference of pressure exerted on the polishing object 101 from the abrasive cloth 107. Since the abrasive cloth 107 in the upper layer is hard but the abrasive cloth 108 in the lower layer is soft, the abrasive cloths 107 and 108 mating with the edge portion of the polishing object 101 is locally deformed. FIG. 5B shows a result of measurement of a pressure exerted on the edge portion of the polishing object 101 by means of a pressure sensor. In the region of +73 to +75 mm, due to large deformation of the abrasive cloths 107 and 108, an excessively high pressure is exerted locally. Conversely, in the region of +60 to +73 mm, the pressure is gradually released and lowered. Then, in the region of 0 to +60 mm, pressure is uniformly exerted. The pressure distribution in respective of these regions correspond to distribution of the polishing speed.

In order to improve non-uniformity of the polishing speed, there is a method to use Suba800 manufactured by Rodel Nitta Company, which is formed of the same material as Suba400 but having higher hardness. Suba800 has a hardness factor of 82 in Asker C hardness meter. FIG. 6A is an enlarged section of the edge portion in the case where Suba800 is used as the abrasive cloth 108 in the apparatus of FIG. 4A. While it is similar even in the case using SuBa400, since the buffer plate 303 is used, displacement is caused between the buffering plate bonding surface of the fixing block 302 and the buffering plate 303 is caused to form a gap portion 316 between the end portion of the buffering plate 303 and the retainer ring 304. The enlarged section shown in FIG. 6A shows an example causing plus side displacement of the buffering plate 303, in which the plus side edge of the polishing object 101 is located completely above the buffering plate 303.

Discussion for the pressure distribution and the polishing speed at the plus side edge portion will be given with reference to FIG. 6B. In this case, Suba800 as the abrasive cloth 108 of the lower layer is hard, local deformation amount of the abrasive cloths 107 and 108 at the edge portion of the polishing object 101 is small even when the polishing object 101 is depressed onto the abrasive cloths 107 and 108. Therefore, in the region of +73 to +75 mm of FIG. 6B, excessive pressure may be exerted by shifting of the polishing object 101 during polishing. Thus, the pressure exerted from the abrasive cloth 107 is equivalent to the case where Suba400 is used. In the region of +60 to +73 mm, since local deformation amount is small, the pressure to be exerted on the polishing object 101 becomes uniform. Accordingly, as shown in FIG. 7, in a region of +60 to 73 mm, the polishing speed becomes uniform to make the uniform region wider than that in the case where Suba400 is used.

It should be noted that displacement between the buffering plate bonding surface of the fixing block 302 and the buffering plate 303 is caused by the structure of the fixing block 302. Therefore, assembling method of the buffering plate will be discussed with reference to FIGS. 4A and 4B. For example, in the fixing block 302 for 6 inch wafer, on the buffering plate bonding surface having an internal diameter of 151 mm, the buffering plate 303 having an external diameter 150 mm which is smaller than the bonding surface in the extent of 1 mm, is bonded. Next, the retainer ring 304 is engaged to the fixing block 302 and fixed by means of screws. The reason while the buffering plate 303 is made smaller than the buffering plate bonding surface in the extent of 1 mm, is that if displacement is caused in the buffering plate 303 upon bonding, the retainer ring 304 cannot be engaged unless the buffering plate is formed smaller than the buffering plate bounding surface. It may be possible to bond the buffering plate 303 having greater external diameter than the internal diameter of the buffering plate bonding surface and subsequently cut the portion of the buffer plate extending from the bonding surface. However, in such case, cut edge tends to be irregular to make the polishing speed at the edge portion of the polishing object 101 non-uniform. Accordingly, in the shown construction of the fixing block 302, it becomes necessary to provide a dimensional difference in the extent of 1 mm between the buffering plate 303 and the buffering plate bonding surface. When the external diameter of the buffering plate 302 is smaller than the internal diameter of the buffering plate bonding surface of the fixing block in the extent of 1 mm, a gap portion of 1 mm at the maximum is formed. As a result, as shown by the pressure profile in the region of −75 to −71 mm of FIG. 6B, the pressure to be exerted on the polishing object 101 located above the gap portion, from the abrasive cloth, can be lowered not only in the region of 1 mm from the edge but also in the region of 1 to 4 mm from the edge due to deformation of the buffering plate 303 toward the gap portion 316. As a result, as shown in the region of −75 to −71 mm of FIG. 7, the polishing speed of the polishing object 101 in the region of 4 mm from the edge becomes lower than that of other portion and thus becomes non-uniform. Even in the method using Suba400 as the abrasive clot 108 in the lower layer, the polishing speed becomes low in the region of −75 to −71 mm due to displacement of the buffering plate 303. However, since the polishing speed in the region where the edge portion of the polishing object 101 is located above the buffering plate is also low, influence of displacement for non-uniformity of the polishing speed is lesser than that of the case where Suba800 is used as the abrasive cloth 108 of the lower layer.

Also, as a solution for non-uniformity of the polishing speed in the edge portion of the polishing object, there is a method to contact a wider width retainer ring to the abrasive cloth to exert a pressure, as proposed on a material of VMIC conference, Jun. 27 to 29, 1995, pp 525 to 527. This is the method to control the polishing speed by applying pressure on the base plate 415 and the retainer ring 404, as shown in FIG. 8A. The polishing method under typical polishing condition will be discussed with reference to FIG. 8A. On the abrasive cloth 107 rotated at 30 r.p.m., the polishing fluid is supplied from the polishing fluid supply nozzle (not shown) in a rate of 200 cc/min. Under this condition, the polishing object 101 held on the base plate 415 via the buffering plate 403 and the retainer ring 404 and the abrasive cloth 107 are fitted under pressure. By supplying air into an air bag 412 for the retainer ring and an air bag 413 for the base plate to apply a load of 7 psi on the retainer ring 404 and the base plate 415. The fixing block 402 is driven to rotate on the own axis. Under such condition, polishing is performed.

In this method, since local deformation of the abrasive cloth 107 and 108 at the edge portion of the polishing object 101 is received by the outer peripheral portion of the lower surface of the retainer ring 404, the pressure becomes uniform in the region of +60 to +75 mm. As a result, the polishing speed of the edge portion on the plus side becomes the same as in-plane region as shown by the profile.

However, since the buffering plate 403 is used even in such retainer ring contact method, similarly to the method using Suba800, displacement may be caused between the buffering plate bonding surface of the base plate and the upper surface of the polishing object 101 to form a gap portion 416 in the extent of 1 mm as shown in the enlarged section of the edge portion on the minus side in FIG. 8A. As a result, as shown by the pressure profile in FIG. 8B, the pressure on the edge and the area in the vicinity thereof is lowered due to presence of the gap portion 416. However, since the retainer ring 404 restricts deformation of the abrasive cloths 107 and 108, the deformation amount of the abrasive cloth 107 located over the edge portion is smaller than that in the case where Suba800 is used. Therefore, the region where the pressure is lowered is in a range of 3 mm from the edge, which is smaller than the range of 4 mm in the case where Suba800 is used. Accordingly, as shown in the region of −75 to −72 mm of FIG. 9, the polishing speed of the polishing object within the range of 3 mm from the edge becomes lower than that in other region and thus to be non-uniform.

In the construction of the fixing block in the conventional method, since the external diameter of the buffering plate 303 is smaller than the diameter of the buffering plate bonding portion of the fixing block 302 in the extent of 1 mm as shown in FIG. 6A maximum 1 mm of gap portion 316 is formed at certain bonding position of the buffering plate 303. By influence of this gap, in the method using Suba800 as the abrasive cloth 108, the polishing speed of the polishing object 101 in the region 4 mm from the edge becomes lower than that in other region to make polishing speed non-uniform. On the other hand, even in the method, in which the retainer ring 404 is contacted with the abrasive cloth 107 as shown in FIG. 8, the polishing speed of the polishing object 101 in the region 3 mm from the edge becomes lower than that in other region to make polishing speed non-uniform.

Accordingly, in the conventional polishing process, a region inappropriate for fabrication of the semiconductor device created in the polishing object is a region of 4 mm from the edge in the method using Suba800 and 3 mm from the edge in the method where the retainer ring 404 is contacted with the abrasive cloth. However, a currently available region where the semiconductor device can be fabricated in the fabrication process other than polishing process, is 2 mm from the edge. Therefore, the region of 2 to 4 mm from the edge lacks flatness to be a cause of defects in the product.

SUMMARY OF THE INVENTION

It is an object of the present invention to provide a polishing apparatus which can obtain uniform polishing speed over an entire polishing surface and whereby improve yield of material of a polishing object, upon performing polishing of the polishing object by holding the polishing object by a holding means on a rotary polishing table having an abrasive cloth on the upper surface.

In order to accomplish the above-mentioned and other objects, according to one aspect of the present invention, a polishing apparatus comprises:

a rotary polishing table carrying an abrasive cloth on the upper surface thereof;

a device for supplying a polishing fluid on the rotary polishing table;

a polishing object holding device for holding a polishing object opposing the abrasive cloth via a disc-shaped buffering plate having a given elasticity, and for driving the polishing object to rotate with maintaining contact with the abrasive cloth under pressure;

a ring-shaped retainer incorporated in the polishing object holding means and detachably fitted on an outer peripheral edge of the polishing object, the ring-shaped retainer extending over the peripheral end portion of the buffering plate for embracing.

According to another aspect of the present invention, a polishing apparatus comprises:

a rotary polishing table carrying an abrasive cloth on the upper surface thereof;

a device for supplying a polishing fluid on the rotary polishing table;

a polishing object holding device for holding a polishing object opposing the abrasive cloth via a disc-shaped buffering plate having a given elasticity, and for driving the polishing object to rotate with maintaining contact with the abrasive cloth under pressure;

a ring-shaped retainer incorporated in the polishing object holding device and detachably fitted on an outer peripheral edge of the polishing object, the ring-shaped retainer extending over the peripheral end portion of the buffering plate for embracing; and a pressurizing device for depressing the polishing object and the ring-shaped retainer onto the abrasive cloth with a predetermined pressure.

In the either construction, it is preferred that the ring-shaped retainer has a first component having an inner periphery mating with the peripheral edge of the buffering plate and a second component formed integrally with the first component has an upper surface mating with the lower surface of the buffering plate. In such case, the second component may have an inner periphery mating with the peripheral edge of the polishing object.

In the preferred construction, the polishing object holding device may include a fixing block for holding the polishing object via the buffering plate at fixed position thereon, and the first component of the retainer may extend vertically and detachably engage with the peripheral edge portion of the fixing block. The second component of the retainer may extend horizontally and have an internal diameter slightly greater than an external diameter of the polishing object.

In the later-mentioned aspect of the present invention, the pressurizing device may comprise a first pressurizing device for applying a first predetermined pressure for depressing the polishing object onto the abrasive cloth, and second pressurizing device for applying a second predetermined pressure for depressing the retainer onto the abrasive cloth. Preferably, the first and second pressurizing devices may be adjustable of the first and second predetermined pressures independently of the other. The pressurizing devices may be pneumatic devices developing the predetermined pressure by a pneumatic pressure.

As set forth above, in the polishing apparatus according to the present invention, the buffering plate having greater external diameter than that of the polishing object. Therefore, no gap portion where the polishing object does not contact with the buffering plate, may be formed. Thus, irregularity of the pressure to be exerted from the abrasive cloth onto the polishing object may not be caused to reduce fluctuation of the polishing speed.

In addition, in the later-mentioned embodiment, by depressing the polishing object and the ring-shaped retainer onto the abrasive cloth. The polishing speed can be uniform over the entire polishing surface.

BRIEF DESCRIPTION OF THE DRAWINGS

The present invention will be understood more fully from the detailed description given herebelow and from the accompanying drawings of the preferred embodiment of the present invention, which, however, should not be taken to be limitative to the invention, but are for explanation and understanding only.

In the drawings.

DESCRIPTION OF THE PREFERRED EMBODIMENT

The present invention will be discussed hereinafter in detail in terms of the preferred embodiment of the present invention with reference to the accompanying drawings. In the following description, numerous specific details are set forth in order to provide a thorough understanding of the present invention. It will be obvious, however, to those skilled in the art that the present invention may be practiced without these specific details. In other instance, well-known structures are not shown in detail in order to avoid unnecessarily obscuring the present invention.

Figure 1A:
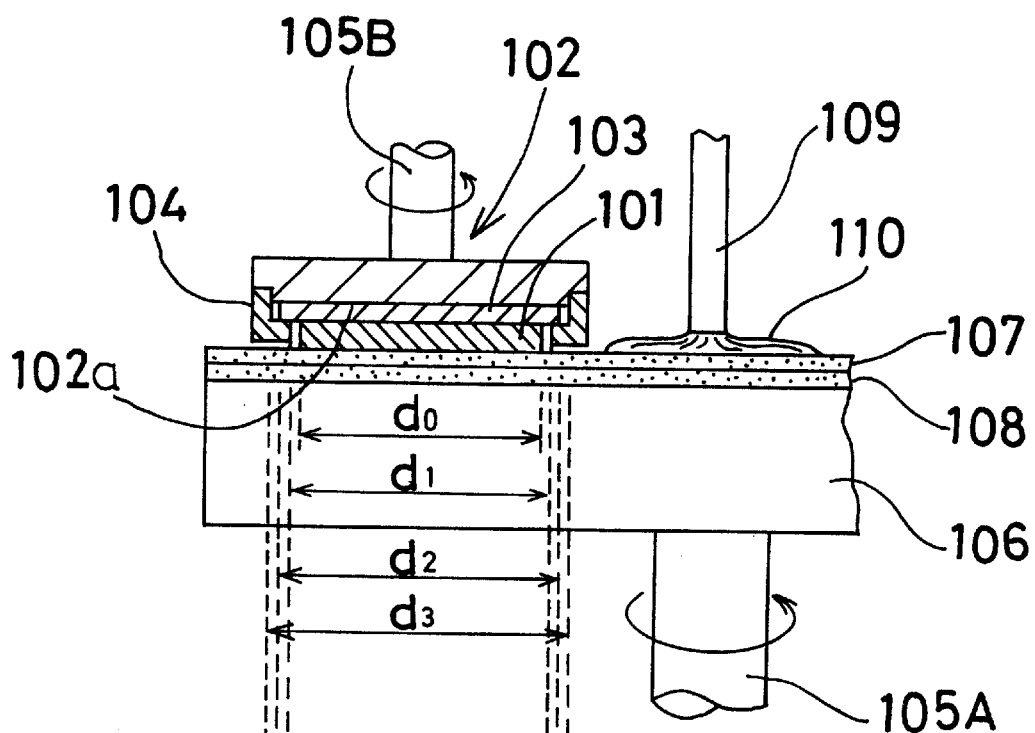
FIG. 1A is a section showing a major construction of the first embodiment of a polishing apparatus according to the present invention.
Figure 1B:
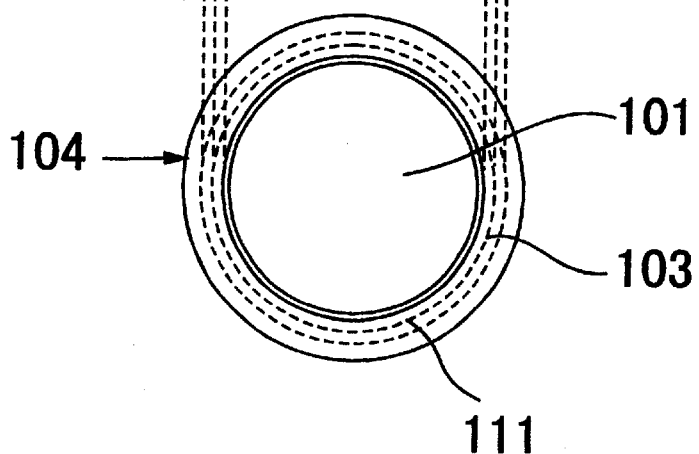
FIG. 1B is a plan view of a polishing object fixing block in the first embodiment of the polishing apparatus of FIG. 1A.
Figure 2A:
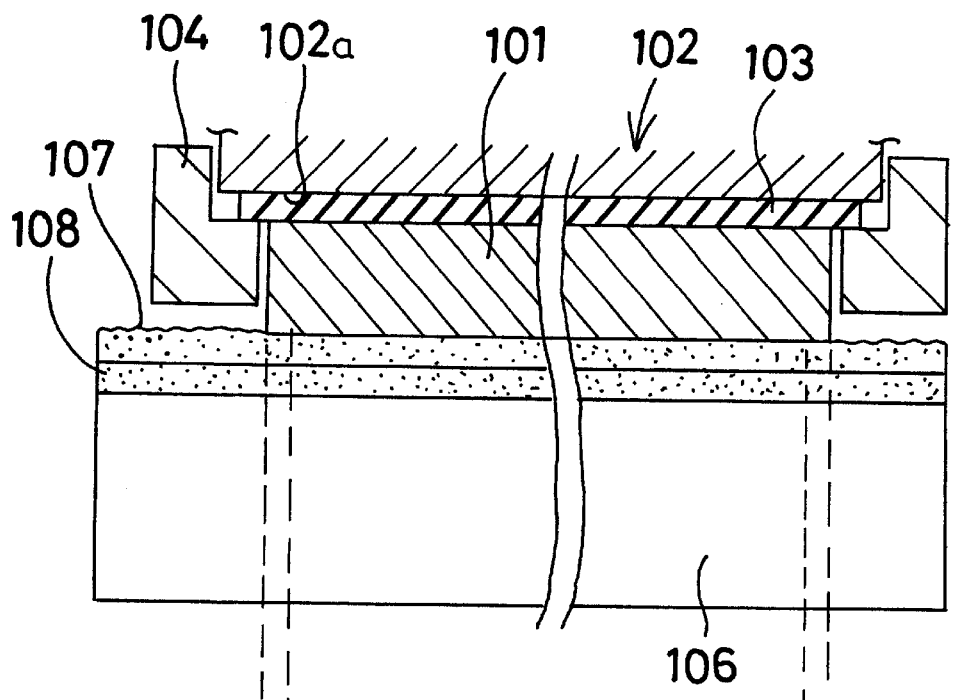
FIG. 2A is a partial enlarged section of the fixing block in the first embodiment of the polishing apparatus of FIG. 1A.
Figure 2B:
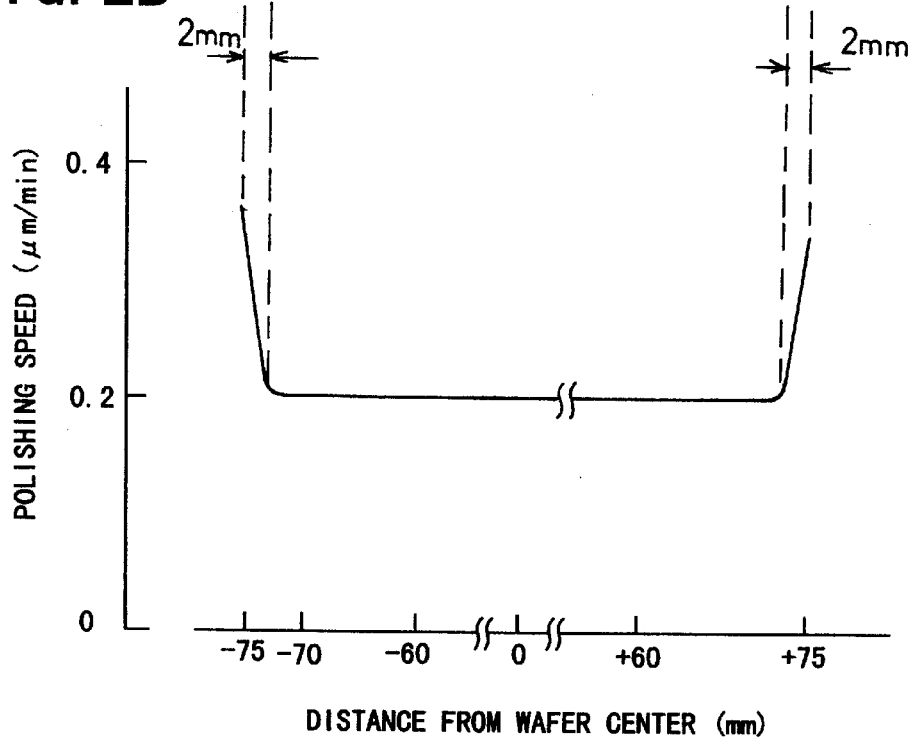
FIG. 2B is a chart showing a polishing speed in a wafer section corresponding to a distance from a center of the wafer.

FIG. 1A is a section showing a major construction of the first embodiment of a polishing apparatus according to the present invention, FIG. 1B is a plan view of a polishing object fixing block in the first embodiment of the polishing apparatus of FIG. 1A, FIG. 2A is a partial enlarged section of the fixing block in the first embodiment of the polishing apparatus of FIG. 1A, and FIG. 2B is a chart showing a polishing speed in a wafer section corresponding to a distance from a center of the wafer.

In FIG. 1A, a polishing object fixing block 102 holding a thin disc shaped polishing object 101 is formed into a disc shaped configuration and has a rotary shaft 105B for rotation thereabout. On the lower surface, the polishing object fixing block 102 is formed with a flat buffering plate bounding surface 102a having a diameter $d_3$ for holding a buffering plate 103 having an external diameter $d_2$ ($d_2<d_3$) in tightly fitted position. A cross-sectionally L-shaped annular retainer ring 104 is provided coaxially with the rotary shaft 105B on the lower side of the outer peripheral portion of the fixing block 102. The vertically extending portion of the cross-sectionally L-shaped annular retainer ring, having an internal diameter $d_3$ is adapted to be detachably engaged with a cylindrical portion of the fixing block 102 having a diameter $d_3$ for further fixing the polishing object 101. The inner end surface of a horizontal portion of the cross-sectionally L-shaped retainer ring is in cylindrical shape having an internal diameter $d_1$ ($d_1<d_2$) and extends inwardly to clamp the peripheral portion of the buffering plate 103 having the external diameter $d_2$. The polishing object 101 having external diameter $d_0$ is received within the cylindrical portion of the retainer ring 104. FIG. 1B is a plan view of the lower surface of the fixing block 102, in which a portion 111 where the retainer ring 104 covers the buffering plate, is shown.

A rotary polishing table 106 is a horizontal disc shape having a rotary shaft 105A at the center thereof. On the upper surface of the rotary polishing table 106, two layers of abrasive cloths are bonded. The lower surface of the polishing object 101 is polished on the abrasive cloth. It is preferred that, as an upper layer abrasive cloth 107, IC1000 which is prepared by foaming and hardening polyurethane resin as set forth in the discussion of the background art, and as the lower layer, Suba800 (hard), which is prepared by impregnating polyurethane resin into polyester fiber nonwoven fabric.

A polishing fluid supply nozzle 109 is provided for supplying a polishing fluid on the abrasive cloth.

In the polishing apparatus for the semiconductor wafer of 6 inch diameter ($d_0$=150 mm), respective of the foregoing dimensions are internal diameter $d_1$ of the retainer ring 104 is 151 mm, external diameter $d_2$ of the buffering plate 103 is 156 mm, and the external diameter $d_3$ of the buffering plate bonding surface 102a is 160 mm.

FIG. 2A is a partial enlarged section of the polishing object fixing block 102 of the polishing apparatus of FIG. 1A, and FIG. 2B is a chart showing the polishing speed in the wafer section corresponding to distance from the center of the wafer. In FIG. 2A, the edge portion of the polishing object 101 (wafer) is located at completely inside of the end edge of the buffering plate 103, the pressure to be exerted on the polishing object 101 becomes uniform. As shown in FIG. 2B, except for the region of 2 mm from the edge of the polishing object 101, the polishing speed becomes uniform.

Figure 3A:
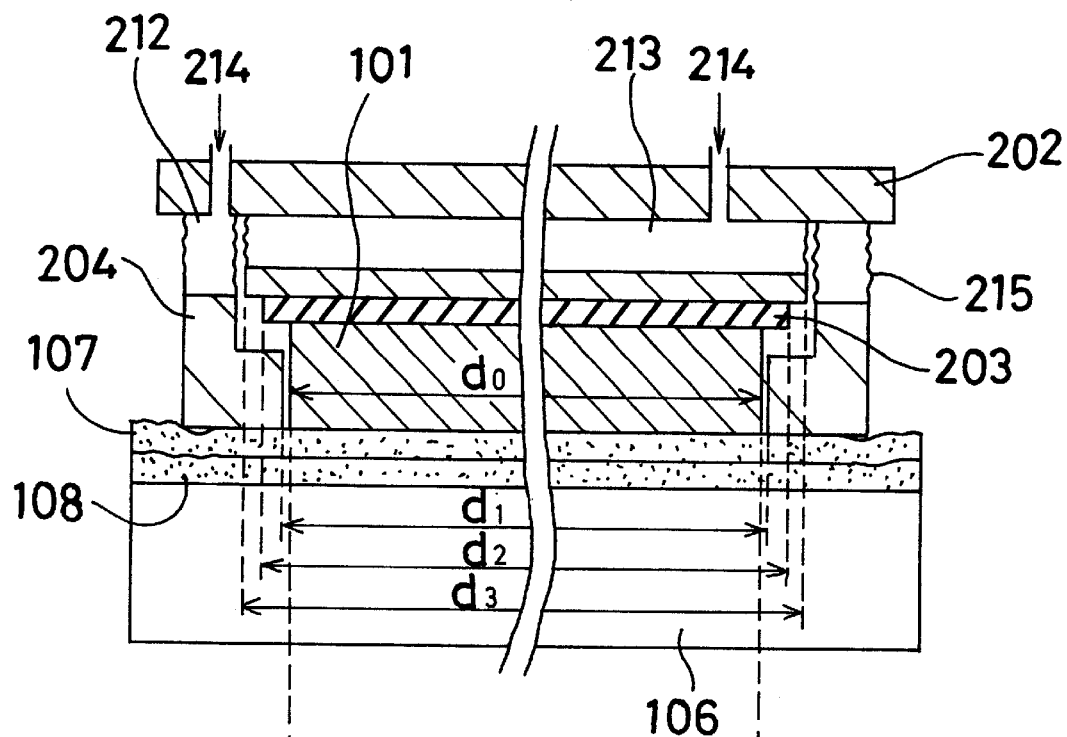
FIG. 3A is a partial enlarged section of the fixing block in the second embodiment of the polishing apparatus.

FIG. 3A is a partial enlarged section of the major components of another embodiment of the polishing apparatus according to the present invention, and FIG. 3 is a chart showing a polishing speed in the wafer section corresponding to a distance from the center of the wafer. In FIG. 3A, a polishing object fixing block 202 is in a form of a rotary disc having a not shown rotary shaft at the center thereof. On the lower surface of the polishing object fixing block 202, air bags 213 and 212 for applying a load on the polishing object and a retainer ring 204 by a pneumatic pressure. On the lower surface of the air bag 213, a disc-shaped base plate 215 having an external diameter of $d_3$ is provided. On the lower surface of the base plate 215, a bonding surface for a buffering plate 203 having an external diameter $d_2$ ($d_2<d_3$) is formed. The retainer ring 204 is annular shaped configuration with L-shaped cross section. The retainer ring 204 is designed to depress a horizontally extending bottom portion in the L-shaped cross-section onto the two layers of abrasive cloths 107 and 108 bonded on the upper surface of the rotary polishing table 106 which is identical to that of the former embodiment of FIG. 1A, by a downward load applied by the air bag 212 for the retainer ring. The polishing object 101 having an external diameter $d_0$ is arranged at the central portion on the lower surface of the buffering plate 203 having the external diameter $d_2$ ($d_2>d_0$). The buffering plate 203 is exerted a load by the pneumatic pressure in the air bag 213 via the base plate 215 to depress the polishing object 101 onto the upper surface of the abrasive cloth 107. Also, the polishing object 101 is centered by the inner end surface (internal diameter $d_1$) of the horizontally extending portion of the cross-sectionally L-shaped retainer ring 204 in coaxial fashion with the rotary shaft. In addition, the horizontally extending portion of the cross-sectionally L-shaped retainer ring 204 is extended inwardly to clamp the peripheral portion of the buffering plate 203 having the external diameter $d_2$ ($d_1<d_2$). Since the internal diameter of the vertically extending portion of the cross-sectionally L-shaped retainer ring 204 is slightly greater than the external diameter $d_3$ of the base plate 215, the retainer ring 204 is loosely fitted to the base plate 215.

In the polishing apparatus for 6 inch diameter semiconductor wafer ($d_0$=150 mm) constructed as shown in FIG. 3, it is preferred that the internal diameter $d_1$ of the retainer ring 204 is 151 mm, the external diameter $d_2$ of the buffering plate is 156 mm, the external diameter $d_3$ of the base plate is 160 mm, and an external diameter $d_4$ of the retainer ring is 180 mm.

Figure 3B:
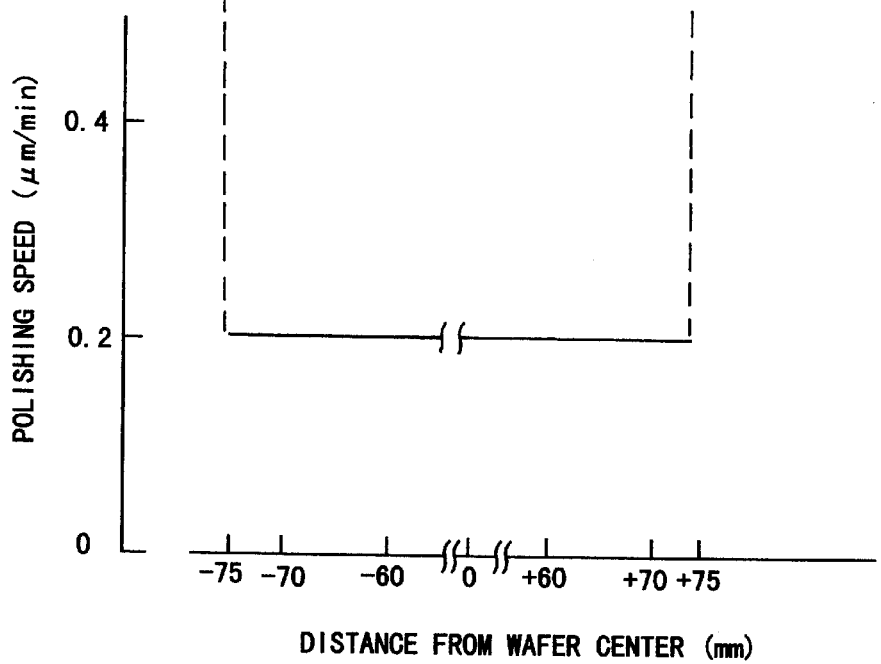
FIG. 3B is a chart showing a polishing speed in a wafer section corresponding to a distance from a center of the wafer.
Figure 4A:
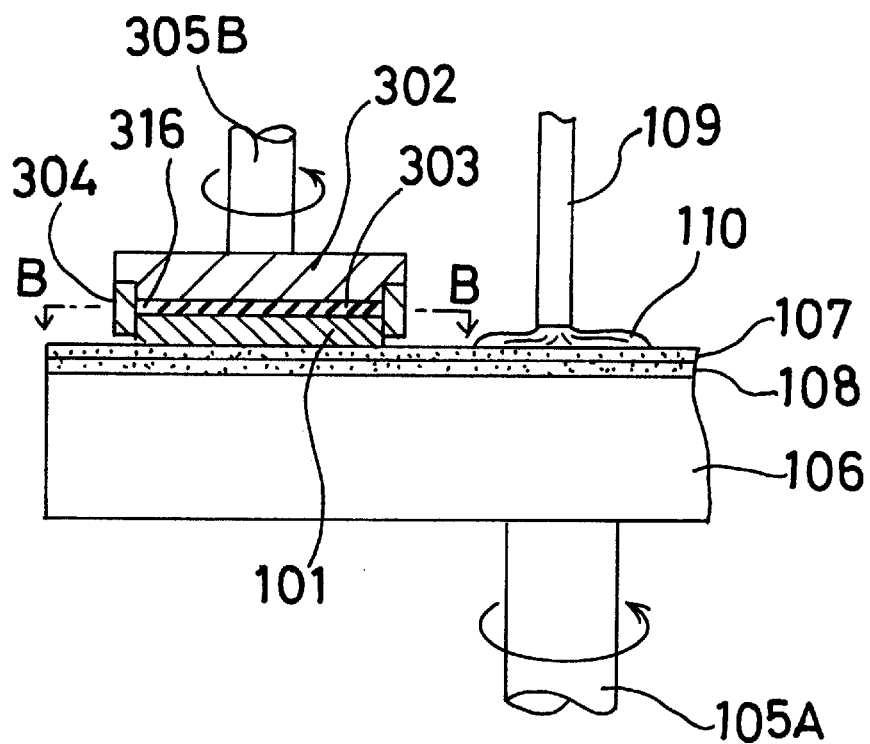
FIG. 4A is a partial section showing a major construction of the conventional polishing apparatus.
Figure 4B:
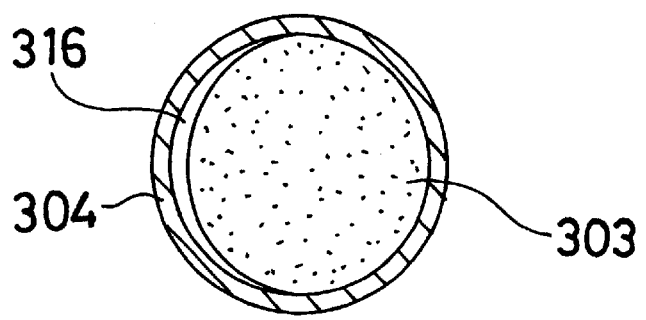
FIG. 4B is a cross-section taken along line B—B of FIG. 4A.
Figure 4C:
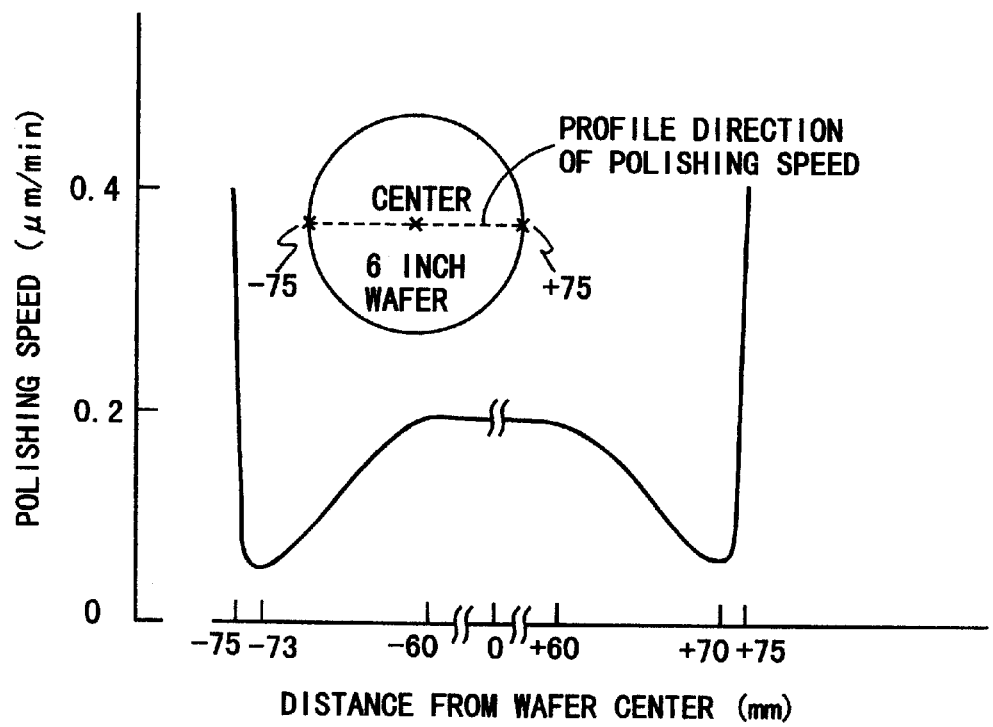
FIG. 4C is a chart showing a polishing speed distribution in the diametric direction of the wafer.
Figure 5A:
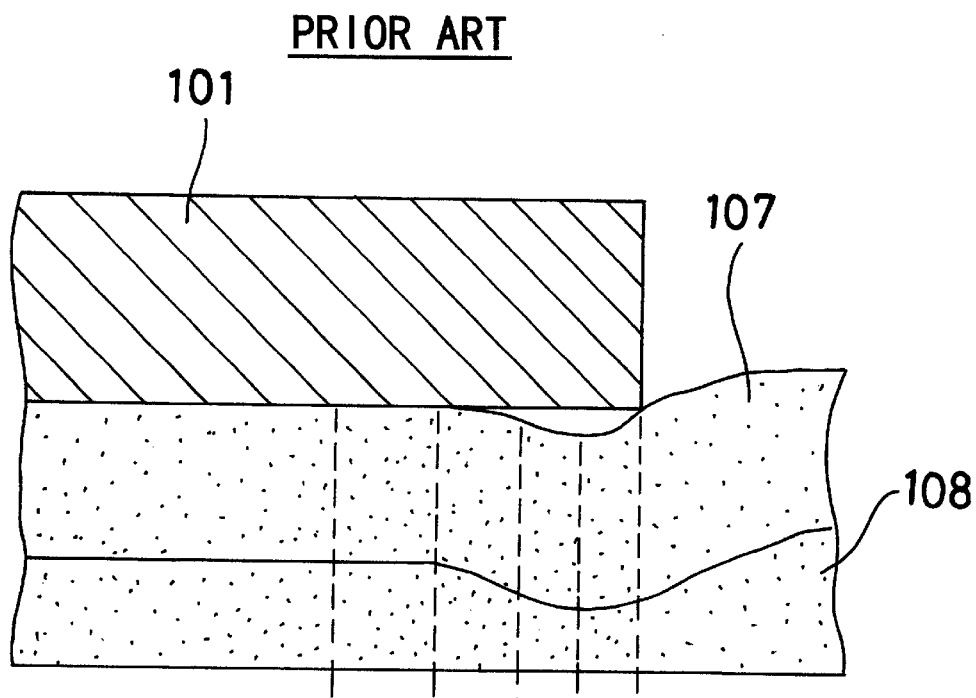
FIG. 5A is a partial enlarged section of the polishing apparatus of FIG. 4A.
Figure 5B:
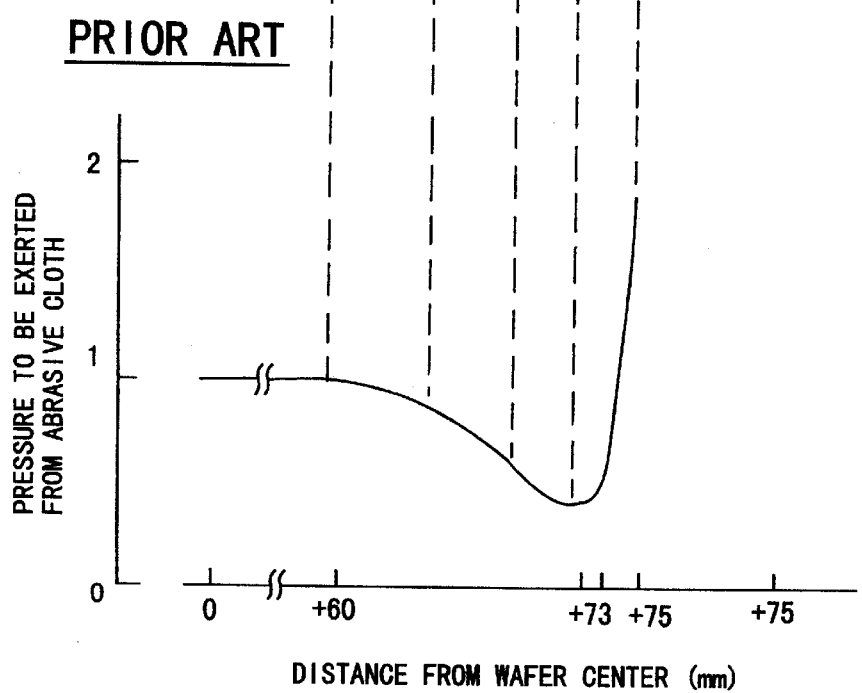
FIG. 5B is a chart of a pressure applied from the abrasive cloth corresponding to a distance from the center of the wafer.
Figure 6A:
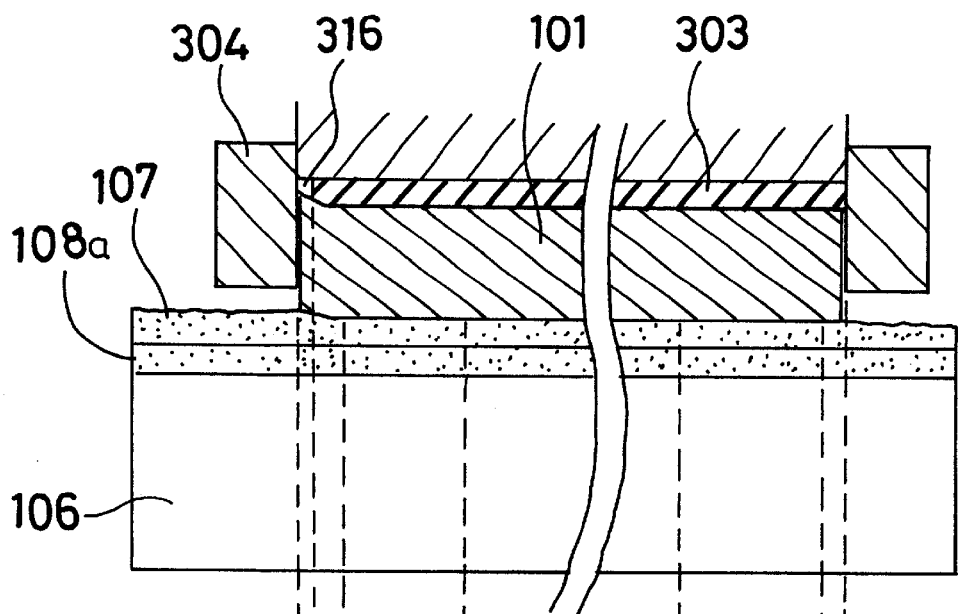
FIG. 6A is a partial enlarged section of another conventional polishing apparatus.
Figure 6B:
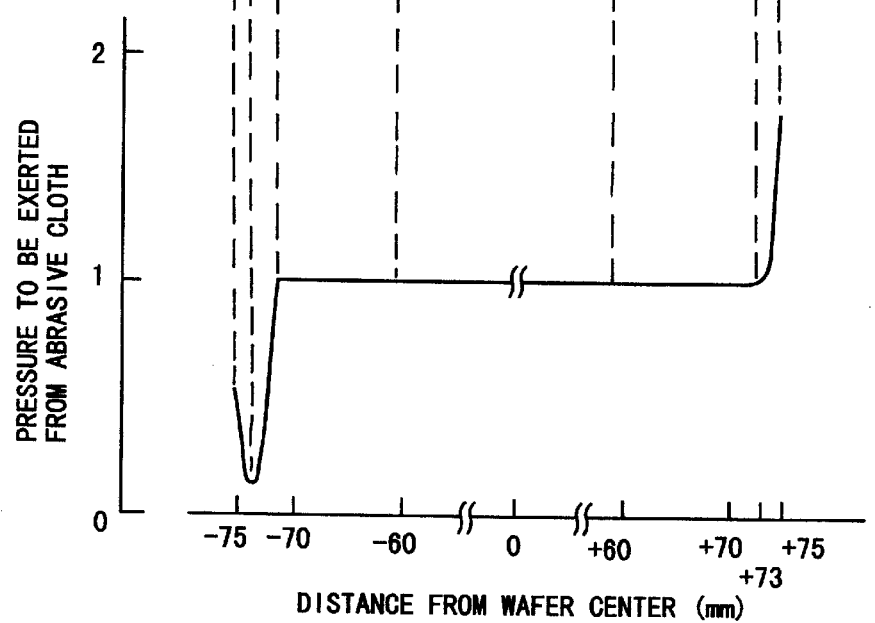
FIG. 6B is a chart of a pressure applied from the abrasive cloth corresponding to a distance from the center of the wafer.
Figure 7:
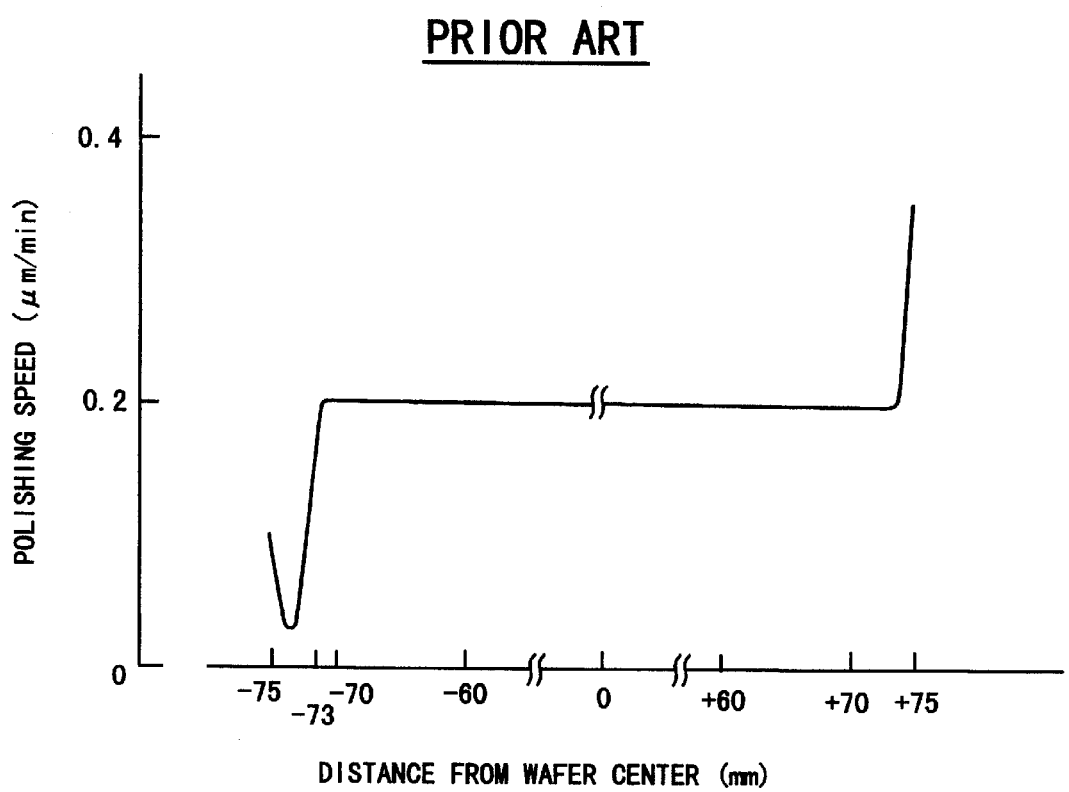
FIG. 7 is a chart showing a polishing speed in the polishing apparatus of FIG. 6A.
Figure 8A:
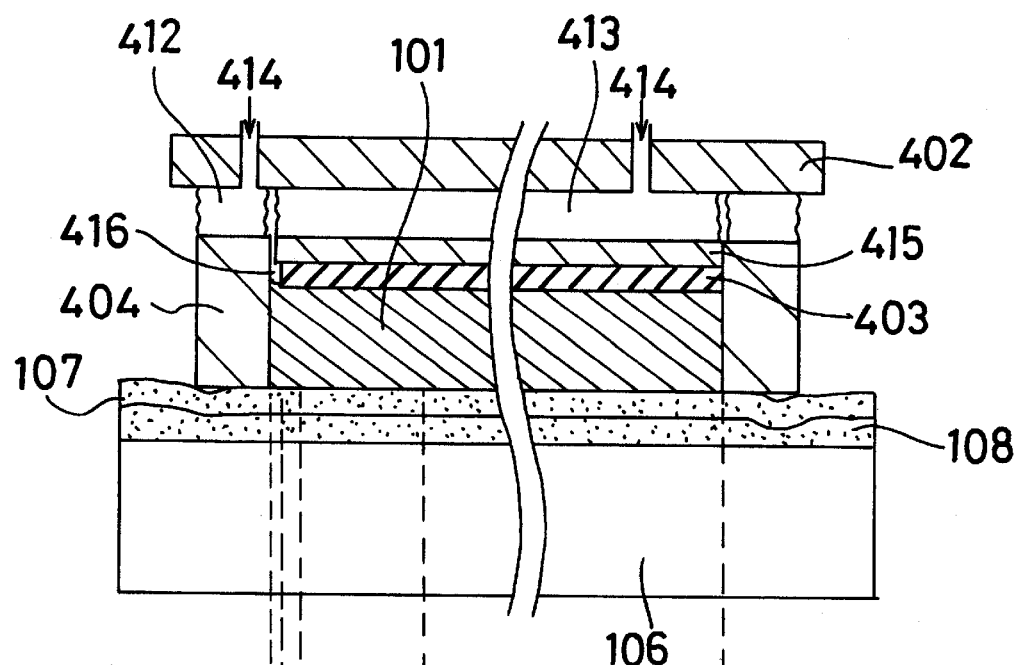
FIG. 8A is a partial enlarged section of a further conventional polishing apparatus.
Figure 8B:
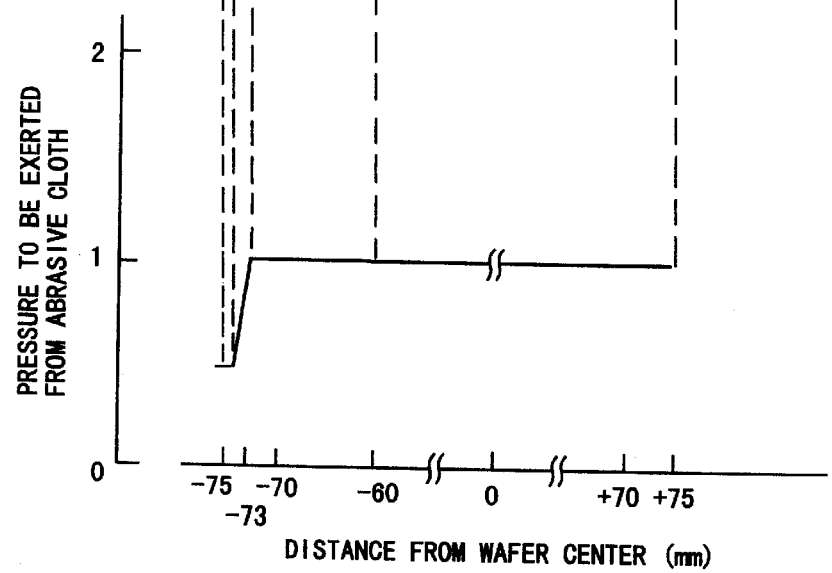
FIG. 8B is a chart of a pressure applied from the abrasive cloth corresponding to a distance from the center of the wafer.
Figure 9:
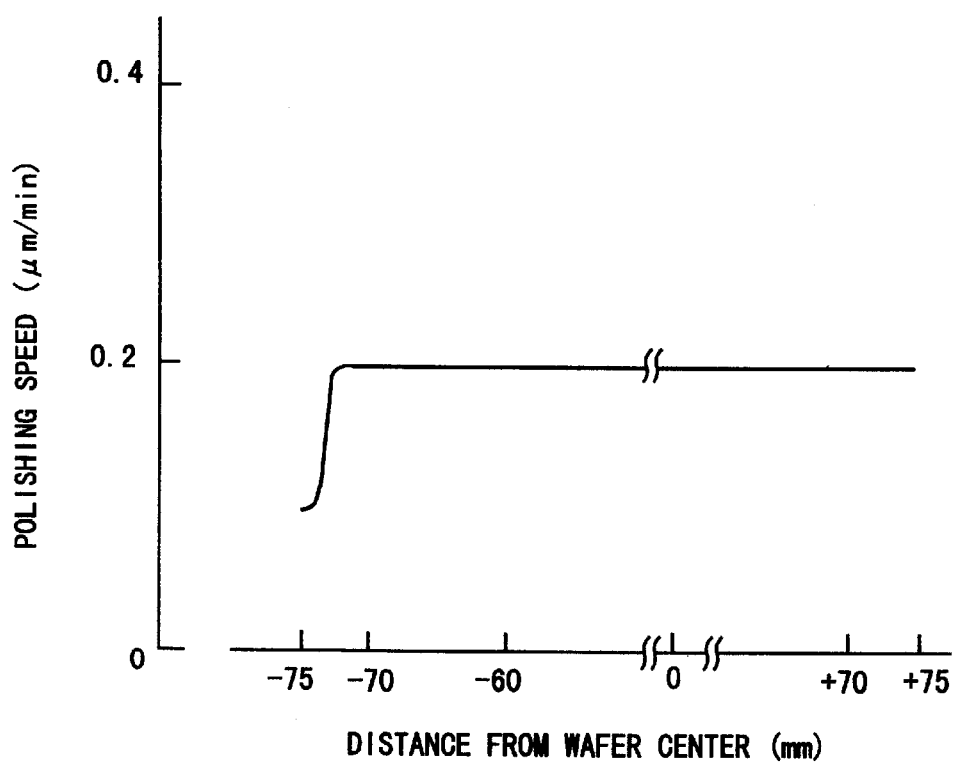
FIG. 9 is a chart showing a polishing speed in the polishing apparatus of FIG. 8A.

In the polishing apparatus of FIG. 3A, constructed as set forth above, predetermined pressures are supplied to the air bags 212 and 213 with adjusting the pneumatic pressure to depress the polishing object 101 and the retainer ring 204 onto the abrasive cloths 107 and 108 on the rotary polishing table 106 for performing polishing. As a result, the chart of the polishing speed in the section corresponding to the distance from the center of the wafer as shown in FIG. 3B.

In the condition set forth above, the entire edge portion of the polishing object 101 is located on the buffering plate 203. Also, local deformation of the abrasive clothes 107 and 108 in the edge portion of the polishing object 101 is received by the outer peripheral portion on the lower surface of the retainer ring 204 instead of the edge portion of the polishing object 101. Thus, the pressure to be exerted on the lower surface of the polishing object 101 becomes uniform. As a result, polishing speed of the polishing object 101 becomes uniform over the entire portion.

As set forth above, according to the present invention, since the end portion of the buffering plate is completely covered with the horizontally extending portion of the cross-sectionally L-shaped retainer ring, the pressure to be exerted on the end portion of the polishing object during polishing becomes uniform. Therefore, the polishing speed at the end portion of the polishing object becomes uniform. As a result, the width of the outside region, in which the semiconductor device cannot be fabricated, to be creased through the polishing process, can be reduced from 4 mm in the method using hard abrasive cloth, such as Suba800 in the lower layer to 2 mm. Therefore, number of chip yieldable from the wafer for semiconductor can be increased. On the other hand, even in the system, in which the retainer ring is contacted with the abrasive cloth under pressure, the polishing speed becomes uniform over the entire surface to further increase number of chips yieldable from the wafer.

Although the present invention has been illustrated and described with respect to exemplary embodiment thereof, it should be understood by those skilled in the art that the foregoing and various other changes, omissions and additions may be made therein and thereto, without departing from the spirit and scope of the present invention. Therefore, the present invention should not be understood as limited to the specific embodiment set out above but to include all possible embodiments which can be embodied within a scope encompassed and equivalents thereof with respect to the feature set out in the appended claims.

What is claimed is:

1. A polishing apparatus comprising:
   a rotary polishing table carrying an abrasive cloth on the upper surface thereof;
   a device for supplying a polishing fluid on said rotary polishing table;
   a polishing object holding device for holding a polishing object opposing said abrasive cloth wherein the polishing object holding device comprises a disc-shaped buffering plate having a given elasticity, and wherein the polishing object holding device is utilized for driving said polishing object to rotate and maintain contact with said abrasive cloth under pressure;
   a ring-shaped retainer incorporated in said polishing object holding device and detachably fitted on an outer peripheral edge of said polishing object, said ring-shaped retainer having an L-shaped cross-sectional shape which includes a ring shaped retainer projection on the inner peripheral surface thereof, said projection having an internal diameter smaller than the external diameter of the buffering plate, said projection extending over the peripheral end portion of a bottom surface of said buffering plate.

2. A polishing apparatus as set forth in claim 1, wherein said ring-shaped retainer has a first component having an inner periphery mating with the peripheral edge of said buffering plate and a second component being said projection, formed integrally with said first component and having an upper surface mating with the lower surface of said buffering plate.

3. A polishing apparatus as set forth in claim 2, wherein said second component has an inner periphery mating with the peripheral edge of said polishing object.

4. A polishing apparatus as set forth in claim 2, wherein said polishing object holding device further comprises a fixing block for holding said polishing object via said buffering plate at a fixed position thereon, and said first component of said retainer extends vertically and detachably engages with the peripheral edge portion of said fixing block.

5. A polishing apparatus as set forth in claim 2, wherein said second component of said retainer extends horizontally and has an internal diameter slightly greater than an external diameter of said polishing object.

6. A polishing apparatus comprising:
   a rotary polishing table carrying an abrasive cloth in the upper surface thereof;
   a device for supplying a polishing fluid on said rotary polishing table;
   a polishing object holding device for holding a polishing object opposing said abrasive cloth wherein the polishing object holding device comprises a disc-shaped buffering plate having a given elasticity, and wherein the polishing object holding device is utilized for driving said polishing object to rotate and maintain contact with said abrasive cloth under pressure;
   a ring-shaped retainer incorporated in said polishing object holding device and detachably fitted on an outer peripheral edge of said polishing object, said ring-shaped retainer having an L-shaped cross-sectional shape which includes a ring shaped retainer projection on the inner peripheral surface thereof, said projection having an internal diameter smaller than the external diameter of the buffering plate, said projection extending over the peripheral end portion of a bottom surface of said buffering plate; and
   a pressurizing device for depressing said polishing object and said ring-shaped retainer onto said abrasive cloth.

7. A polishing apparatus as set forth in claim 6, wherein said ring-shaped retainer has a first component having an inner periphery mating with the peripheral edge of said buffering plate and a second component being said protection, formed integrally with said first component has an upper surface mating with the lower surface of said buffering plate.

8. A polishing apparatus as set forth in claim 7, wherein said second component has an inner periphery mating with the peripheral edge of said polishing object.

9. A polishing apparatus as set forth in claim 7, wherein said polishing object holding device further comprises a fixing block for holding said polishing object via said buffering plate at a fixed position thereon, and said first component of said retainer extends vertically and detachably engages with the peripheral edge portion of said fixing block.

10. A polishing apparatus as set forth in claim 7, wherein said second component of said retainer extends horizontally and has an internal diameter slightly greater than an external diameter of said polishing object.

11. A polishing apparatus as set forth in claim 6, wherein said pressurizing device comprises a first pressurizing device for applying a first predetermined pressure for depressing said polishing object onto said abrasive cloth, and a second pressurizing device for applying a second predetermined pressure for depressing said retainer onto said abrasive cloth.

12. A polishing apparatus as set forth in claim 11, wherein said first and second pressurizing devices are adjustable independently of the other.

13. A polishing apparatus as set forth in claim 6, wherein said pressurizing device is a pneumatic device developing a pneumatic pressure.

14. A polishing apparatus as recited in claim 1, wherein an external diameter of the polishing object is less than an external diameter of the buffering plate.

15. A polishing apparatus as recited in claim 6, wherein an external diameter of the polishing object is less than an internal diameter of the buffering plate.

16. A polishing apparatus as recited in claim 6, wherein the pressurizing device further comprises a base plate, and wherein an external diameter of the base plate is greater than an external diameter of the buffering plate.

* * * * *